(12) United States Patent
Tamura

(10) Patent No.: US 9,035,539 B2
(45) Date of Patent: May 19, 2015

(54) PIEZOELECTRIC VIBRATING PIECE, PIEZOELECTRIC VIBRATOR, OSCILLATOR, ELECTRONIC APPARATUS AND RADIO CONTROLLED TIMEPIECE

(71) Applicant: SII Crystal Technology Inc., Chiba-shi, Chiba (JP)

(72) Inventor: Masanori Tamura, Chiba (JP)

(73) Assignee: SII CRYSTAL TECHNOLOGY INC., Chiba (JP)

( * ) Notice: Subject to any disclaimer, the term of this patent is extended or adjusted under 35 U.S.C. 154(b) by 0 days.

(21) Appl. No.: 14/202,575

(22) Filed: Mar. 10, 2014

(65) Prior Publication Data
US 2014/0254329 A1    Sep. 11, 2014

(30) Foreign Application Priority Data
Mar. 11, 2013    (JP) .................................. 2013-048454

(51) Int. Cl.
*H03H 9/21*     (2006.01)
*H03B 5/32*     (2006.01)
*G04R 20/10*    (2013.01)

(52) U.S. Cl.
CPC .. *H03H 9/21* (2013.01); *H03B 5/32* (2013.01); *G04R 20/10* (2013.01)

(58) Field of Classification Search
CPC ........... H03H 9/19; H03H 9/21; H03H 9/215; H03H 2003/026; B06B 1/0659
USPC .............................. 310/370; 331/156; 333/200
See application file for complete search history.

(56) References Cited

U.S. PATENT DOCUMENTS

| 4,538,461 A    * | 9/1985 | Juptner et al. ............. 73/504.16 |
| 6,346,765 B1   * | 2/2002 | Kikuchi et al. ............... 310/367 |
| 2006/0201248 A1 * | 9/2006 | Unno ........................ 73/504.12 |
| 2012/0098389 A1 * | 4/2012 | Dalla Piazza et al. ........ 310/348 |

FOREIGN PATENT DOCUMENTS

| JP | 2006-345517 A | 12/2006 |
| JP | 2006-345519 A | 12/2006 |

* cited by examiner

*Primary Examiner* — J. San Martin
(74) *Attorney, Agent, or Firm* — Brinks Gilson & Lione

(57) ABSTRACT

A piezoelectric vibrating piece is provided including: a pair of vibrating arm sections; a base section which is provided between the pair of vibrating arm sections; and connecting sections which connect base end sections of the pair of vibrating arm sections and a base end section of the base section, in which the vibrating arm sections have bending points and the vibrating arm sections extend in a direction away from the base section from the base end sections of the vibrating arm sections to the bending points, and the vibrating arm sections extend along the base section from the bending points to leading end sections of the vibrating arm sections.

8 Claims, 6 Drawing Sheets

PIEZOELECTRIC VIBRATING PIECE, PIEZOELECTRIC VIBRATOR, OSCILLATOR, ELECTRONIC APPARATUS AND RADIO CONTROLLED TIMEPIECE

RELATED APPLICATIONS

This application claims priority under 35 U.S.C. §119 to Japanese Patent Application No. 2013-048454 filed on Mar. 11, 2013, the entire content of which is hereby incorporated by reference.

BACKGROUND OF THE INVENTION

1. Field of the Invention

The present invention relates to a piezoelectric vibrating piece, a piezoelectric vibrator, an oscillator, an electronic apparatus and a radio controlled timepiece.

2. Background Art

In the related art, a piezoelectronic resonator is known which includes a piezoelectric vibrating piece having a pair of vibrating arm sections and a base section, and accommodates the piezoelectric vibrating piece in a package by fixing the base section provided between the pair of vibrating arm sections in the package (see, JP-A-2006-345517 and JP-A-2006-345519).

SUMMARY OF THE INVENTION

However, according to the related art described above, with a size reduction of the piezoelectronic resonator, when vibrating or when receiving impact from outside, it is possible for corner sections of the leading end sections and outer side surfaces of the pair of vibrating arm sections to come into contact with a leading end section of the base section, resulting in cracks, defects or the like in the leading end sections of the vibrating arm sections. If cracks, defects or the like occur in the leading end sections of the vibrating arm sections, impact resistance and reliability of the piezoelectric vibrating piece decrease.

Accordingly, a configuration in which contact with the leading end sections of the vibrating arm sections and the base section is avoided by increasing a length of a connecting section that connects the base section and the base end section of the vibrating arm sections is conceivable, in other words, by widening a distance of a fork section between the vibrating arm sections and the base section, and by widely maintaining a clearance between the leading end section of the base section and the leading end sections of the vibrating arm sections. However, it is known that if the length of the connecting section is increased, since the connecting section itself is liable to vibrate, an equivalent serial resistance value R2 (hereinafter, referred to as R2) in a secondary vibration mode decreases. Therefore, the piezoelectric vibrating piece conducts bending vibration not in a desired fundamental wave mode but in the secondary vibration mode or in a high-order vibration mode. That is, if the length of the connecting section is increased, there is a problem that a desired frequency cannot be obtained.

Thus, the invention is made in view of the above situations and an object of the invention is to provide a piezoelectric vibrating piece capable of avoiding contact with leading end sections of vibrating arm sections and a base section while being vibrated in a fundamental wave mode in the piezoelectric vibrating piece in which the base section is provided between a pair of vibrating arm sections. Further, another object of the invention is to provide a piezoelectric vibrator, an oscillator, an electronic apparatus and a radio controlled timepiece having such a piezoelectric vibrating piece.

According to an aspect of the invention, there is provided a piezoelectric vibrating piece including: a pair of vibrating arm sections; a base section which is provided between the pair of vibrating arm sections; and connecting sections which connect base end sections of the pair of vibrating arm sections and a base end section of the base section, in which the vibrating arm sections have bending points and the vibrating arm sections extend in a direction away from the base section from the base end sections of the vibrating sections to the bending points, and the vibrating arm sections extend along the base section from the bending points to leading end sections of the vibrating arm sections. Moreover, the bending point referred to as herein does not necessarily mean only "bending" and may mean "curving" that is gently curved in the vibrating aim.

In the piezoelectric vibrating piece, in an extending direction of the base section, when a length from the base end sections to the leading end sections of the vibrating arm sections is L1, and a length from the base end sections of the vibrating arm sections to the bending points is L2, $L2/L1>0.17$ may be satisfied.

In the piezoelectric vibrating piece, widened sections of width dimensions that are wider than that of the base end sections of the vibrating arm sections may be formed in leading end sections of the vibrating arm sections.

In the piezoelectric vibrating piece, the base section may extend to the vicinity of the leading end sections of the vibrating arm sections.

In the piezoelectric vibrating piece, groove sections extending along a longitudinal direction of the vibrating arm sections may be formed in main surfaces of the vibrating arm sections.

In addition, according to another aspect of the invention, there is provided a piezoelectric vibrator including: the piezoelectric vibrating piece according to the aspect of the invention in a package which is hermetically sealed, in which the piezoelectric vibrating piece is mounted in the package in the base section.

In addition, according to still another aspect of the invention, there is provided an oscillator including: the piezoelectric vibrator according to the aspect of the invention, in which the piezoelectric vibrator is electrically connected to an integrated circuit as an oscillator.

In addition, according to still another aspect of the invention, there is provided an electronic apparatus including: the piezoelectric vibrator according to the aspect of the invention, in which the piezoelectric vibrator is electrically connected to a timer section.

In addition, according to still another aspect of the invention, there is provided a radio controlled timepiece including: the piezoelectric vibrator according to the aspect of the invention, in which the piezoelectric vibrator is electrically connected to a filter section.

According to the piezoelectric vibrating piece of the aspect of the invention, in the piezoelectric vibrating piece in which the base section is provided between the pair of vibrating arm sections, it is possible to provide the piezoelectric vibrating piece capable of avoiding contact with the leading end sections of the vibrating arm sections and the base section while conducting the vibration in the fundamental wave mode. Further, it is possible to provide the piezoelectric vibrator, the oscillator, the electronic apparatus and the radio controlled timepiece having such a piezoelectric vibrating piece.

Specifically, since the distance between the leading end sections of the vibrating arm sections and the base section can be widened without widening the clearance of the fork section formed between the vibrating arm sections and the base section, it is possible to avoid contact with the leading end sections of the vibrating arm sections and the base section while realizing the bending vibration in the fundamental wave mode without decreasing R2.

Further, when the length from the base end sections to the leading end sections of the vibrating arm sections is L1, and the length from the base end sections of the vibrating arm sections to the bending points is L2, if L2/L1>0.17 is satisfied, it is easy to further reliably conduct the bending vibration in the fundamental wave mode.

Further, according to the piezoelectric vibrator, the oscillator, the electronic apparatus and the radio controlled timepiece of the aspect of the invention, it is possible to improve the operation reliability.

DETAILED DESCRIPTION OF THE PREFERRED EMBODIMENTS

Hereinafter, a piezoelectric vibrating piece, a piezoelectric vibrator, an oscillator, an electronic apparatus and a radio controlled timepiece according to an embodiment of the invention will be described.

Figure 1:
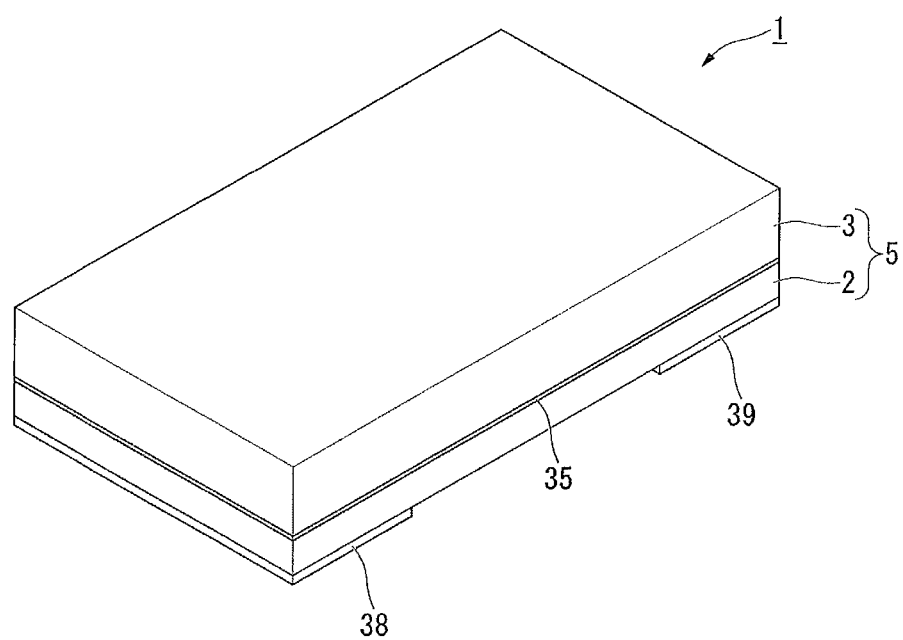
FIG. 1 is an external perspective view of a piezoelectric vibrator according to an embodiment of the invention.
Figure 2:
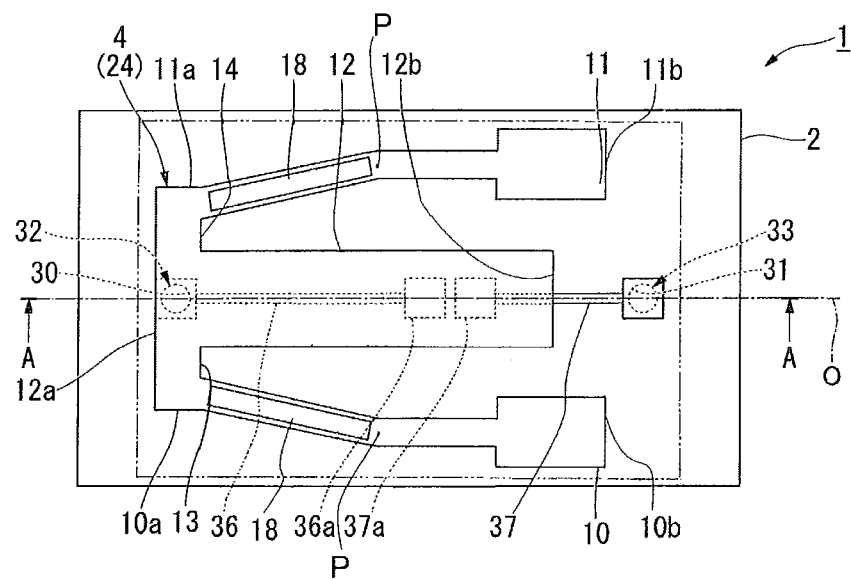
FIG. 2 is an internal configuration view of the piezoelectric vibrator illustrated in FIG. 1.
Figure 3:
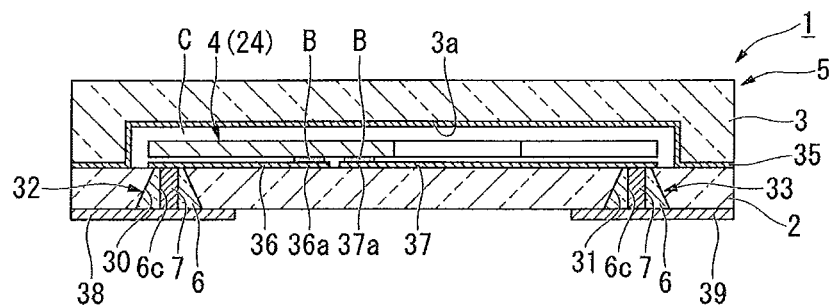
FIG. 3 is a cross-sectional view of the piezoelectric vibrator taken along line A-A illustrated in FIG. 2.

For example, as illustrated in FIGS. 1 to 3, a piezoelectric vibrator 1 of the embodiment is a surface mount type piezoelectric vibrator 1 which includes a box-shaped package 5 formed of a base substrate 2 and a lid substrate 3 which are bonded through a bonding material 35, and a piezoelectric vibrating piece 4 accommodated in a cavity C which is sealed inside the package 5. Moreover, the form of the package 5 is not limited to the embodiment and may be a ceramic package having a base substrate of ceramic, a frame member, and a lid substrate made of metal.

External electrodes 38 and 39 disposed in the base substrate 2 are electrically connected to the piezoelectric vibrating piece 4 by a pair of penetration electrodes 32 and 33 passing through the base substrate 2. In case of the ceramic package, electrical connection between the inside and the outside of the package can be achieved by forming the penetration electrodes in the base substrate of the ceramic or by leading out the electrodes from between multi-layered ceramic substrates.

Figure 4:
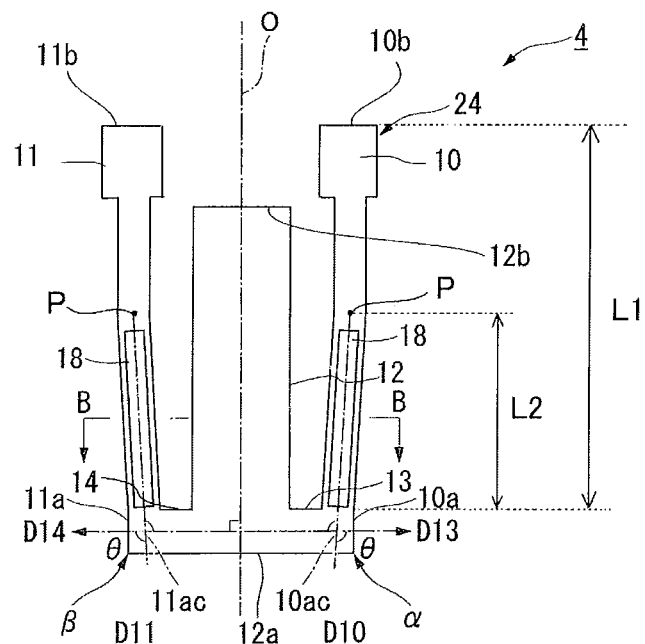
FIG. 4 is a plan view of a piezoelectric vibrating piece.
Figure 5:
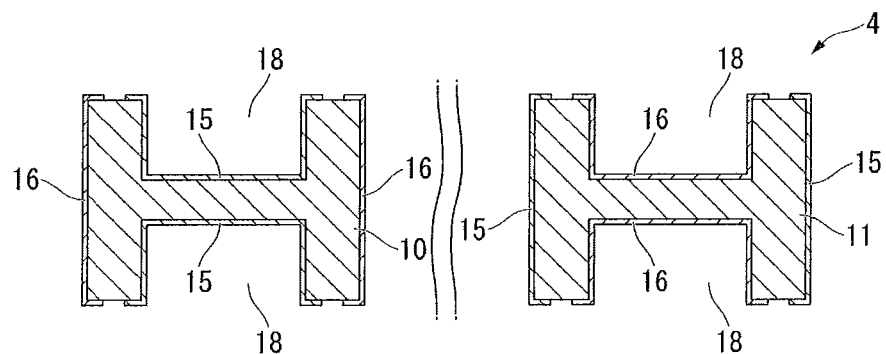
FIG. 5 is a view illustrating a cross-section in line B-B of FIG. 4.

For example, as illustrated in FIG. 4, the piezoelectric vibrating piece 4 includes a tuning fork type piezoelectric plate 24 formed from a piezoelectric material such as crystal, lithium tantalate or lithium niobate, and conducts bending vibration by applying a predetermined voltage. Moreover, when roughly dividing the bending vibration, there is a fundamental wave mode and a high-harmonic wave mode, and in order to obtain a desired frequency (for example, 32.768 kHz), it is necessary to vibrate in the fundamental wave mode. In order to vibrate in the fundamental wave mode, it is necessary that R1<R2 if an equivalent serial resistance value R1 (hereinafter, referred to as R1) of the fundamental wave mode of the piezoelectric vibrating piece 4 and an equivalent serial resistance value R2 of a secondary high-harmonic wave mode are compared to each other. That is, since the piezoelectric vibrating piece 4 conducts the bending vibration in the lowest mode of the equivalent serial resistance value, in order to conduct the bending vibration in the fundamental wave mode, it is necessary to decrease R1 and increase R2. On the other hand, if R2 decreases and R1>R2, the piezoelectric vibrating piece 4 vibrates in the secondary high-harmonic wave mode.

The piezoelectric plate 24 includes a pair of vibrating arm sections 10 and 11 disposed across a central axis O; a base section 12 that is disposed between the pair of vibrating arm sections 10 and 11, and is fixed to the outside; and a pair of connecting sections 13 and 14 that connect base end sections 10a and 11a of the pair of vibrating arm sections 10 and 11, and a base end section 12a of the base section 12. Moreover, a dimension of the vibrating arm sections 10 and 11 in a length direction is set to be a distance two times or more (a distance between the vibrating arm sections 10 and 11 in the base end sections 10a and 11a) between the vibrating arm sections 10 and 11. Further, the base section 12 extends to the vicinity of leading end sections of the vibrating arm sections 10 and 11. Here, the vicinity of the leading end sections refers to a side of the leading end from a midpoint of the vibrating arm sections 10 and 11 in a longitudinal direction.

Widened sections are formed in leading end sections 10b and 11b of the pair of vibrating arm sections 10 and 11. That is, the pair of vibrating arm sections 10 and 11 are hammerhead types in which a width dimension of the leading end sections 10b and 11b is widened compared to that of the base end sections 10a and 11a, and a weight of the leading end sections 10b and 11b of the vibrating arm sections 10 and 11, and a moment of inertia when vibrating are higher. Therefore, the vibrating arm sections 10 and 11 easily vibrate and it is possible to shorten lengths of the vibrating arm sections 10 and 11, and to achieve a size reduction. Moreover, here, the vibrating arm sections 10 and 11 of the hammerhead type are described but the piezoelectric vibrating piece to which the invention is applicable is not limited to the hammerhead type. That is, the piezoelectric vibrating piece may be a type in which the width dimension of the leading end sections 10b and 11b is substantially the same as that of the base end sections 10a and 11a, and the piezoelectric vibrating piece may be a type in which the leading end sections 10b and 11b are tapered as compared to the base end sections.

Further, in the embodiment, a distance between the leading end sections 10b and 11b of each of the vibrating arm sections 10 and 11, and the central axis O is wider than that between the base end sections 10a and 11a of each of the vibrating arm sections 10 and 11, and the central axis O. That is, when vibrating in the vibrating arm sections 10 and 11 or when receiving impact from outside, sufficient clearance is ensured so as not to contact the leading end sections 10b and 11b of the vibrating arm sections 10 and 11 and a leading end section 12b of the base section 12.

The clearance is ensured by extending the vibrating arm sections 10 and 11 from the base end sections 10a and 11a in a direction away from the base section 12. That is, the embodiment is characterized in that the vibrating arm sections 10 and 11 have bending points P, and the vibrating arm sections 10 and 11 extend in the direction away from the base section 12 from the base end sections 10a and 11a of the vibrating arm sections 10 and 11 to the bending points P, and the vibrating arm sections 10 and 11 extend along the base section 12 from the bending points P to the leading end sections 10b and 11b of the vibrating arm sections 10 and 11. Moreover, there are the bending points P in the embodiment but the invention of this application is not limited to the embodiment and the invention may have a "curving" shape. In this case, a starting point of the curving is referred to as "the bending point".

Further, the pair of vibrating arm sections 10 and 11 are formed so that a crossing angle θ of directions D10 and D11 facing from each of the leading end sections 10b and 11b to the base end sections 10a and 11a, and directions D13 and D14 in which each of the connecting sections 13 and 14 extends from the base end section 12a of the base section 12 is greater than 90°, in connecting sections α and β of the pair of connecting sections 13 and 14.

Moreover, if the crossing angle θ is greater, the clearance between the base section 12 and the leading end sections 10b and 11b of the vibrating arm sections 10 and 11 can be great. However, since there is a concern that the leading end sections 10b and 11b of the vibrating arm sections 10 and 11 come into contact with an inner wall of the package, the crossing angle θ may also be determined in consideration of the clearance with the inner wall of the package. Further, if the crossing angle θ is too great, since there is a possibility that the bending vibration of the vibrating arm sections 10 and 11 are influenced (for example, the vibration is not conducted at a stable frequency, strength of the vibrating arm section is lowered), the crossing angle θ may also be determined in consideration of the influence on the vibration.

Moreover, for example, a distance Lb between a leading end section 12b of the base section 12 and each of the vibrating arm sections 10 and 11 with respect to a dimension La (for example, 60 μm or the like) of each of the vibrating arm sections 10 and 11 in the width direction is set to be a value (for example, 40 km to 50 μm) depending on the dimension La of each of the vibrating arm sections 10 and 11 in the width direction.

The pair of vibrating arm sections 10 and 11 include excitation electrodes formed of a first excitation electrode 15 and a second excitation electrode 16, which vibrate the pair of vibrating arm sections 10 and 11, on a surface of a piezoelectric body (the piezoelectric plate 24) made of a piezoelectric material.

The base section 12 includes a pair of mount electrodes (not illustrated) by which the first excitation electrode 15 and the second excitation electrode 16 are electrically connected to leading-out electrodes 36 and 37, on the surface of the piezoelectric body (the piezoelectric plate 24) made of the piezoelectric material.

The piezoelectric plate 24 includes groove sections 18, which are formed along a longitudinal direction (an extending direction) of the vibrating arm sections 10 and 11, respectively, on both main surfaces of the pair of vibrating arm sections 10 and 11. For example, the groove sections 18 are formed from the side of the base end of the vibrating arm sections 10 and 11 to approximately the vicinity of the center thereof. Moreover, here, a form in which the groove sections 18 are provided in the vibrating arm sections 10 and 11 is described, but the invention may also be applicable to a piezoelectric vibrating piece in which the groove sections 18 are not provided in the vibrating arm sections 10 and 11. Further, the groove section 18 is provided on the side of the base section 12 from the bending point P but the piezoelectric vibrating piece 4 of the invention is not limited to the embodiment and may extend to the side of the leading ends of the vibrating arm sections 10 and 11 from the bending point P. Further, the groove section is not formed in the vicinity of the bending point P and the groove section 18 may be provided on the side of the base section 12 from the bending point P and/or on the side of the leading end thereof.

The excitation electrodes formed of the first excitation electrode 15 and the second excitation electrode 16 are patterned on an outer surface of the pair of vibrating arm sections 10 and 11 in a state where the excitation electrodes are electrically insulated to each other, and vibrate the pair of vibrating arm sections 10 and 11 at a predetermined frequency in a direction approaching or separating from each other.

More particularly, for example, the first excitation electrode 15 is mainly provided on the groove section 18 of the first vibrating arm section 10 and both side surfaces of the second vibrating arm section 11.

Further, the second excitation electrode 16 is mainly provided on both side surfaces of the first vibrating arm section 10 and on the groove section 18 of the second vibrating arm section 11.

The first excitation electrode 15 and the second excitation electrode 16 are electrically connected to the mount electrodes (not illustrated) through extraction electrodes (not illustrated) on both main surfaces of the base section 12, respectively.

Therefore, a voltage is applied to the piezoelectric vibrating piece 4 through the mount electrodes (not illustrated).

The pair of vibrating arm sections 10 and 11 include a weight metal film (not illustrated) coated on an outer surface for adjusting the frequency, so that vibration states of the pair of vibrating arm sections 10 and 11 themselves are adjusted to be vibrated within a range of a predetermined frequency.

The weight metal film (not illustrated) includes, for example, a rough adjustment film (not illustrated) for roughly adjusting the frequency and a fine adjustment film (not illustrated) for finely adjusting the frequency.

The frequency adjustment is performed by weight adjustment of the rough adjustment film and the fine adjustment film, and the frequency of the pair of vibrating arm sections 10 and 11 is adjusted so as to fit within a range of a predetermined target frequency.

For example, as illustrated in FIG. 3, the piezoelectric vibrating piece 4 is bump bonded on the leading-out electrodes 36 and 37 which are provided on a surface (a surface facing the lid substrate 3) of the base substrate 2 by a bump B such as gold. Moreover, if a ceramic package is used, it is also possible to mount the piezoelectric vibrating piece 4 on the base substrate of the ceramic by a conductive adhesive.

More particularly, the first excitation electrode 15 of the piezoelectric vibrating piece 4 is bump bonded on the second leading-out electrode 37 through a first mount electrode (not illustrated) and the bump B and the second excitation electrode 16 is bump bonded on the first leading-out electrode 36 through a second mount electrode (not illustrated) and the bump B.

Therefore, the piezoelectric vibrating piece 4 is supported in a state of being floated from the surface (the surface facing the lid substrate 3) of the base substrate 2 and each of the mount electrodes (not illustrated) is electrically connected to each of the leading-out electrodes 36 and 37. Moreover, in the base substrate 2, a concave section may be provided in a region facing the leading end section of the piezoelectric vibrating piece 4. It is possible to reduce the possibility of the leading end section of the piezoelectric vibrating piece 4 from coming into contact with the base substrate 2 which causes cracks, defects or the like occur in the leading end section due to external impact by providing the concave section.

The lid substrate 3 is formed in a plate shape by a transparent insulating substrate made of a glass material, for example, soda-lime glass. Then, a rectangular concave section 3a capable of accommodating the piezoelectric vibrating piece 4 is included on the side of the bonding surface to which the base substrate 2 is bonded. Moreover, in a case of the ceramic package, a lid made of metal is bonded by brazing material or the like.

The concave section 3a forms the cavity C accommodating the piezoelectric vibrating piece 4 by a surface (a surface facing the lid substrate 3) of the base substrate 2 when overlapping both substrates 2 and 3 to each other.

The lid substrate 3 includes the bonding material 35 which is provided on the entire surface thereof facing the base substrate 2. For example, the bonding material 35 is provided over the bonding surface with the base substrate 2 and the entire inner surface of the concave section 3a. In a state where the concave section 3a faces toward the side of the base substrate 2, the lid substrate 3 is anode bonded to the base substrate 2 through the bonding material 35, and hermetically seals the cavity C.

Similar to the lid substrate 3, the base substrate 2 is formed in a plate shape having a size capable of overlapping the lid substrate 3 by a transparent insulating substrate made of a glass material, for example, soda-lime glass or by a ceramic material. The base substrate 2 includes a pair of through holes 30 and 31 that pass through in a thickness direction and are open in the cavity C.

More particularly, for example, the first through hole 30 of the through holes 30 and 31 of the embodiment is formed in a position facing the base end section 12a of the base section 12 of the piezoelectric vibrating piece 4 that is mounted. Further, the second through hole 31 is formed in a position facing between the leading end sections 10b and 11b of the vibrating arm sections 10 and 11. Further, the through holes 30 and 31 are formed in a tapered shape in a cross-section thereof in which diameters thereof are gradually reduced from a first surface to a second surface (a surface facing the lid substrate 3) of the base substrate 2.

Moreover, in the embodiment, each of the through holes 30 and 31 is formed in the tapered shape in the cross-section thereof but the invention is not limited to the embodiment, and, for example, each of the through holes 30 and 31 may be a through hole which passes through the base substrate 2 in the thickness direction with a uniform diameter, and may pass through the base substrate 2.

The pair of through holes 30 and 31 include the pair of penetration electrodes 32 and 33 which are formed so as to fill each of the through holes 30 and 31. The penetration electrodes 32 and 33 are formed of cylindrical bodies 6 and core material sections 7 that are integrally fixed to the through holes 30 and 31 by burning. The penetration electrodes 32 and 33 maintain airtightness in the cavity C by blocking the through holes 30 and 31, and electrically connect the external electrodes 38 and 39, and the leading-out electrodes 36 and 37.

More particularly, for example, the first penetration electrode 32 is disposed by facing the leading-out electrode 36 between the external electrode 38 and the base section 12, and the second penetration electrode 33 is disposed by facing the leading-out electrode 37 between the external electrode 39 and a portion between the leading end sections 10b and 11b of the vibrating arm sections 10 and 11.

The cylindrical body 6 is formed by baking paste-formed glass frit. Moreover, in a case of a ceramic package, the penetration electrode is formed by a via electrode.

More particularly, for example, the cylindrical body 6 is formed in a cylindrical shape having flat opposite ends and substantially the same thickness as the base substrate 2. Then, the cylindrical body 6 fixes the core material section 7 that is inserted in a center hole passing through the cylindrical body 6 in the thickness direction.

Further, in the embodiment, an external shape of the cylindrical body 6 is formed so as to be conical (tapered cross-section) according to the shape of the through holes 30 and 31. Then, the cylindrical body 6 is burned in a state of being filled in the through holes 30 and 31, and is firmly fixed to the through holes 30 and 31.

The core material section 7 is a conductive core material formed in a cylindrical shape by a metal material and, similar to the cylindrical body 6, has flat opposite ends and substantially the same thickness as the base substrate 2.

The core material section 7 is positioned in a center hole 6c of the cylindrical body 6 and is firmly fixed to the cylindrical body 6 by burning of the cylindrical body 6. Then, electronic conductivity is ensured in the penetration electrodes 32 and 33 by the core material section 7 having conductivity.

The base substrate 2 includes the pair of leading-out electrodes 36 and 37 that are patterned by a conductive material (for example, aluminum) on a surface on the side of the bonding surface in which the lid substrate 3 is bonded. The pair of leading-out electrodes 36 and 37 electrically connect the first penetration electrode 32 of the pair of penetration electrodes 32 and 33, and the second mount electrode (not illustrated) of the piezoelectric vibrating piece 4, and electrically connect the second penetration electrode 33 and the first mount electrode (not illustrated) of the piezoelectric vibrating piece 4.

More particularly, for example, the first leading-out electrode 36 is provided to extend toward a supporting section 36a that is disposed in the leading end section 12b of the base section 12 from the first penetration electrode 32 that is disposed in the base end section 12a of the base section 12 along the axial direction of the central axis O.

The first leading-out electrode 36 supports the leading end section 12b of the base section 12 by bump bonding by the bump B of the supporting section 36a in a state of being floated from the surface (the surface facing the lid substrate 3) of the base substrate 2, and is electrically connected to the second mount electrode (not illustrated) of the piezoelectric vibrating piece 4.

The second leading-out electrode 37 is provided to extend toward a supporting section 37a that is disposed in the leading end section 12b of the base section 12 from the second penetration electrode 33 that is disposed in the position between the leading end sections 10b and 11b of the pair of vibrating arm sections 10 and 11 along the axial direction of the central axis O.

The second leading-out electrode 37 supports the leading end section 12b of the base section 12 by bump bonding by the bump B of the supporting section 37a in a state of being floated from the surface (the surface facing the lid substrate 3) of the base substrate 2, and is electrically connected to the first mount electrode (not illustrated) of the piezoelectric vibrating piece 4.

Therefore, the second mount electrode (not illustrated) of the piezoelectric vibrating piece 4 is electrically connected to the first penetration electrode 32 through the first leading-out electrode 36. The first mount electrode (not illustrated) is electrically connected to the second penetration electrode 33 through the second leading-out electrode 37.

The base substrate 2 includes the external electrodes 38 and 39 electrically connected to the pair of penetration electrodes 32 and 33, respectively, on the first surface.

The first external electrode 38 is electrically connected to the second excitation electrode 16 of the piezoelectric vibrating piece 4 through the first penetration electrode 32 and the first leading-out electrode 36.

Further, the second external electrode 39 is electrically connected to the first excitation electrode 15 of the piezoelectric vibrating piece 4 through the second penetration electrode 33 and the second leading-out electrode 37.

The piezoelectric vibrator 1 is operated by applying a predetermined driving voltage with respect to the external electrodes 38 and 39 formed in the base substrate 2, and vibrates the pair of vibrating arm sections 10 and 11 at a predetermined frequency in a direction approaching and separating from each other by flowing a current in the excitation electrodes formed of the first excitation electrode 15 and the second excitation electrode 16 of the piezoelectric vibrating piece 4.

The vibration of the pair of vibrating arm sections 10 and 11 is used as a time source, a timing source of a control signal, a reference signal source or the like.

As described above, according to the piezoelectric vibrating piece 4 of the embodiment, the vibrating arm sections 10 and 11 have the bending points P. The vibrating arm sections 10 and 11 extend in the direction away from the base section 12 from the base end sections 10a and 11a of the vibrating arm sections 10 and 11 to the bending points P, and the vibrating arm sections 10 and 11 extend along the base section 12 from the bending points P to the leading end sections 10b and 11b of the vibrating arm sections 10 and 11. Therefore, it is possible to widen the clearance between the leading end sections 10b and 11b of the vibrating arm sections 10 and 11, and the base section 12 without increasing the length of the connecting sections 13 and 14 (the length of the piezoelectric vibrating piece 4 in the width direction), in other words, without increasing the distance of a fork section between the piezoelectric vibrating piece 4 and the base section 12.

As described above, if the length of the connecting sections 13 and 14 are increased, it is known that the connecting sections 13 and 14 themselves are liable to vibrate and the equivalent serial resistance value R2 of the secondary highharmonic wave mode is reliable to decrease, but according to the embodiment, since there is no need to increase the length of the connecting sections 13 and 14, it is possible to avoid the contact between the leading end sections 10b and 11b of the vibrating arm sections 10 and 11, and the base section 12 while vibrating the piezoelectric vibrating piece 4 in the fundamental wave mode without decreasing R2.

Further, since the contact between the leading end sections 10b and 11b of the vibrating arm sections 10 and 11, and the base section 12 can be avoided, it is possible to increase the longitudinal dimension of the base section 12, that is, to mount the piezoelectric vibrating piece 4 in a wider range. Therefore, it is possible to improve mounting strength of the piezoelectric vibrating piece 4.

Further, it is possible to sufficiently attenuate the vibration, which is generated in the vibrating arm sections 10 and 11, in the base section 12 by increasing the longitudinal dimension of the base section 12. Therefore, it is possible to reduce so-called vibration leakage, that is, vibration leaked on the side of the package which is generated in the vibrating arm sections 10 and 11.

Further, according to simulations carried out by the inventors, when a length from the base end sections 10a and 11a to the leading end sections 10b and 11b of the vibrating arm sections 10 and 11 is L1, and a length from the base end sections 10a and 11a of the vibrating arm sections 10 and 11 to the bending points P is L2, it is recognized that the vibrating arm sections 10 and 11 can further reliably vibrate in the fundamental wave mode if L2/L1>0.17 is satisfied.

That is, if L2/L1 is small, in other words, if the bending points P are near the base end sections 10a and 11a of the vibrating arm sections 10 and 11, it is necessary to increase the crossing angle θ to sufficiently ensure the clearance in the leading end sections 10b and 11b of the vibrating arm sections 10 and 11. However, if the crossing angle θ is increased, as described above, the problem of coming into contact with the package or the vibratory problem of being difficult to bending vibrate in the fundamental wave mode occurs. Thus, the inventors found that the effects described above are further reliably obtained if L2/L1>0.17, from the results of the simulations carried out by the inventors to avoid the problems.

Oscillator

Next, an embodiment of an oscillator according to the invention is described.

Figure 6:
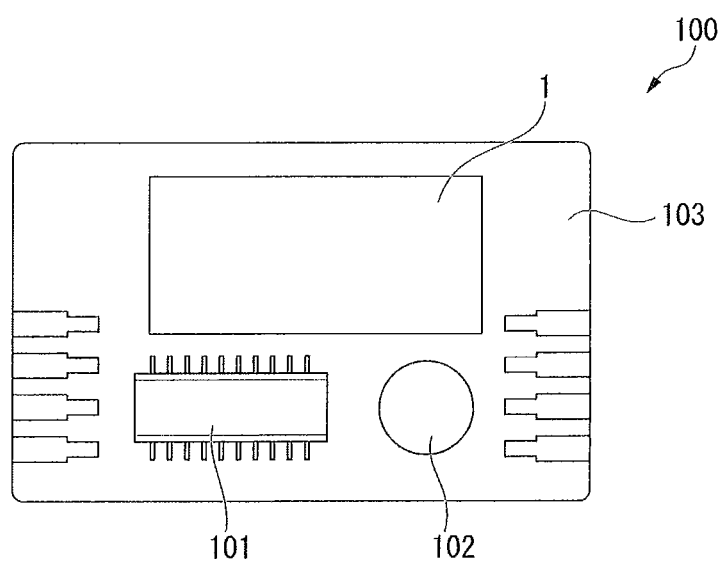
FIG. 6 is a configuration view illustrating an oscillator according to an embodiment of the invention.

As illustrated in FIG. 6, an oscillator 100 according to the embodiment is configured as an oscillator in which the piezoelectric vibrator 1 is electrically connected to an integrated circuit 101.

The oscillator 100 includes the integrated circuit 101 for the oscillator described above, an electronic part 102 such as a capacitor, and the piezoelectric vibrating piece 4 of the piezoelectric vibrator 1 disposed in the vicinity of the integrated circuit 101 on the substrate 103.

The electronic part 102, the integrated circuit 101 and the piezoelectric vibrator 1 are electrically connected to each other by a wiring pattern (not illustrated).

Moreover, each of the configuration parts is molded by a resin (not illustrated).

In the oscillator 100 configured as described above, if a voltage is applied to the piezoelectric vibrator 1, the piezoelectric vibrating piece 4 vibrates in the piezoelectric vibrator 1.

The vibration is converted into an electric signal by piezoelectric characteristics of the piezoelectric vibrating piece 4 and is input into the integrated circuit 101 as an electric signal. After various types of processes are performed by the integrated circuit 101, the input electric signal is output as a frequency signal. Therefore, the piezoelectric vibrator 1 functions as the oscillator.

In addition, it is possible to add functions for controlling an operation date or time of the apparatus or an external apparatus or for providing time, calendar or the like in addition to a single-function oscillator for a timepiece or the like to the configuration of the integrated circuit 101, for example, by selectively setting a real time clock (RTC) module or the like upon request.

As described above, according to the oscillator 100 of the embodiment, it is possible to provide the oscillator 100 being of a high-quality which has superior characteristics and reliability by including the piezoelectric vibrator 1 described above.

Further, in addition thereto, it is possible to obtain the frequency signal with a high accuracy which is stable in a long period.

Electronic Apparatus

Next, an embodiment of an electronic apparatus according to the invention is described.

Moreover, as an example of the electronic apparatus, a portable information apparatus 110 having the piezoelectric vibrator 1 described above is described.

The portable information apparatus 110 of the embodiment is represented, for example, by a cellular phone, and develops and improves a wristwatch of the related art. An outer appearance thereof is similar to the wristwatch and a liquid crystal display is arranged in a portion corresponding to a dial, and a current time or the like can be displayed on a screen.

In addition, in a case of being used as a communication apparatus, it is possible to perform the communication similar to the cellular phone of the related art by removing the wristwatch from the wrist and by using a speaker and a microphone which are incorporated in the inner portion of a band. Furthermore, the portable information apparatus can be significantly downsized and made lightweight compared to the cellular phone of the related art.

Portable Information Apparatus

Next, a configuration of the portable information apparatus 110 of the embodiment is described.

Figure 7:
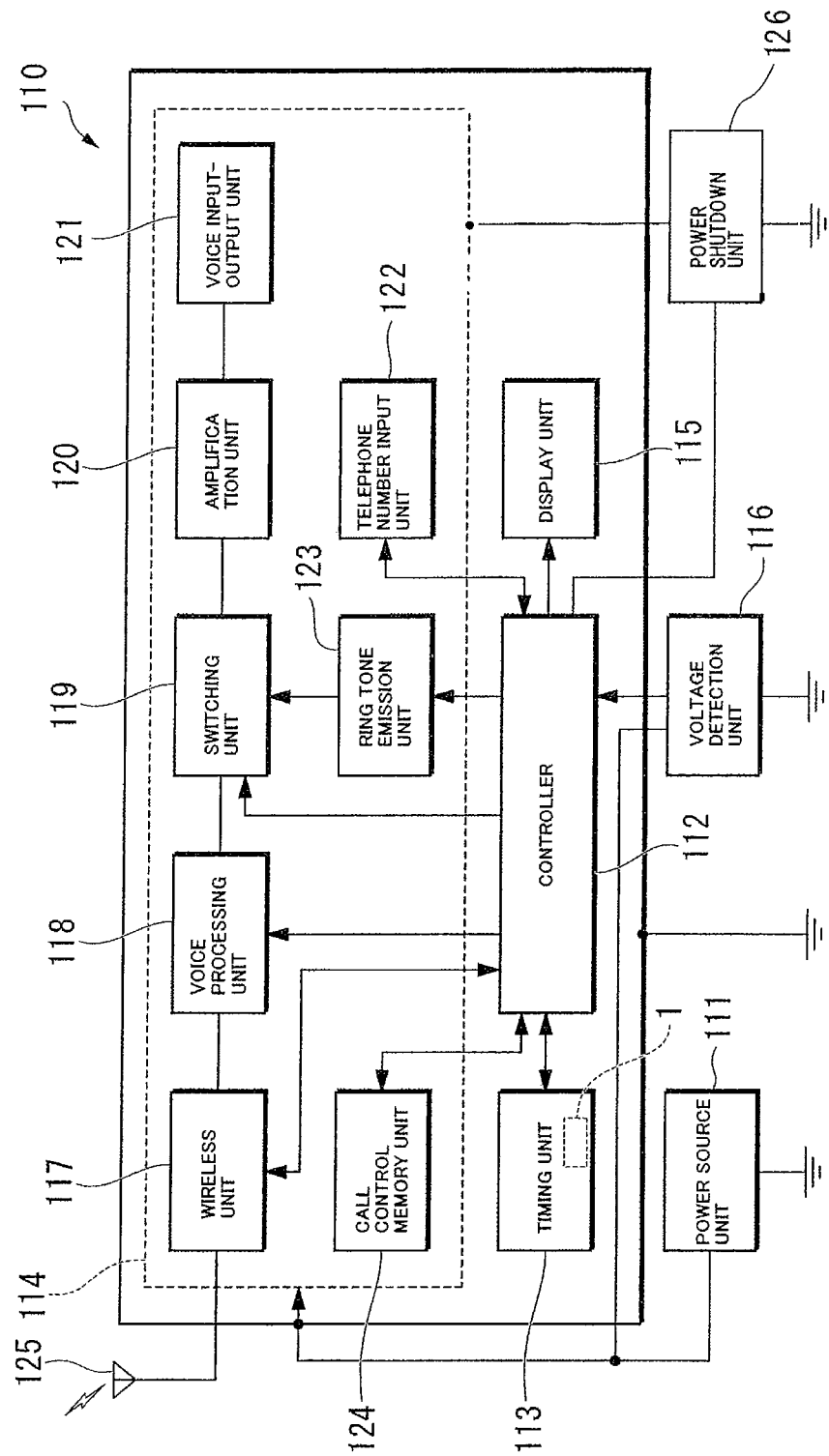
FIG. 7 is a configuration view illustrating an electronic apparatus according to an embodiment of the invention.

As illustrated in FIG. 7, the portable information apparatus 110 includes the piezoelectric vibrator 1 and a power supply section 111 for supplying electric power.

For example, the power supply section 111 is formed of a lithium secondary battery.

A controller 112 that performs various types of control, a timer section 113 that counts the time or the like, a communication section 114 that performs the communication with the outside, a display section 115 that displays various types of information, and a voltage detecting section 116 that detects the voltage of each of function sections are connected in parallel to the power supply section 111.

Then, power can be supplied from the power supply section 111 to each of the function sections.

The controller 112 performs operational control of the entirety of the system such as transmitting and receiving of sound data, measuring or displaying of a current time or the like by controlling each of the function sections.

In addition, the controller 112 includes a ROM in which a program is written in advance, a CPU that reads and executes the program written on the ROM, a RAM that is used as a work area of the CPU or the like.

The timer section 113 includes an integrated circuit incorporating an oscillator circuit, a register circuit, a counter circuit, an interface circuit or the like, and the piezoelectric vibrator 1.

If voltage is applied to the piezoelectric vibrator 1, the piezoelectric vibrating piece 4 vibrates, the vibration is converted into an electric signal by the piezoelectric characteristics having the crystal and is input into the oscillator circuit as the electric signal. The output of the oscillator circuit is binarized and is counted by the register circuit and the counter circuit.

Then, the signal is transmitted to and received from the controller 112 through the interface circuit and the current time, the current date, the calendar information or the like is displayed on the display section 115.

The communication section 114 has the same function as the cellular phone of the related art and includes a radio section 117, a voice processing section 118, a switching section 119, an amplifier 120, a voice input and output section 121, a phone number input section 122, a ring sound generator 123, and a call control memory section 124.

The radio section 117 transmits and receives various data such as voice data to/from a base station through an antenna 125.

The voice processing section 118 codes and decodes the voice signal input from the radio section 117 or the amplifier 120.

The amplifier 120 amplifies the signal input from the voice processing section 118 or the voice input and output section 121 to a predetermined level.

The voice input and output section 121 is configured of a speaker, a microphone or the like, and amplifies the ring sound or reception voice, or collects voice.

In addition, the ring sound generator 123 generates the ring sound in response to a call from the base station. The switching section 119 switches the amplifier 120 connected to the voice processing section 118 into the ring sound generator 123 only when a call is received. Therefore, the ring sound generated in the ring sound generator 123 is output to the voice input and output section 121 through the amplifier 120.

Moreover, the call control memory section 124 stores a program relating to incoming and outgoing call control of the communication. In addition, the phone number input section 122 includes, for example, number keys from 0 to 9 along with other keys, and the phone number of a call destination is input by pressing the number keys.

If the voltage applied to each of the function sections such as the controller 112 by the power supply section 111 is below a predetermined value, the voltage detecting section 116 detects the voltage drop and notifies the controller 112. At this time, the predetermined voltage value is a value that is set in advance as a minimum voltage required to stably operate the communication section 114 and, for example, is approximately 3 V.

The controller 112 which receives the voltage drop notification from the voltage detecting section 116 prohibits operations of the radio section 117, the voice processing section 118, the switching section 119 and the ring sound generator 123. Particularly, stopping of the operation of the radio section 117 in which power consumption is great is essential. Furthermore, the fact that the communication section 114 cannot be used due to a deficiency of the battery power is displayed on the display section 115.

That is, the operation of the communication section 114 is prohibited by the voltage detecting section 116 and the controller 112, and the fact can be displayed on the display section 115. The display may be a text message and may be a x (cross) mark on a phone icon displayed in an upper portion of a display surface of the display section 115 as a more intuitive display.

Moreover, it is possible to further reliably stop the function of the communication section 114 by including a power shutdown section 126 capable of selectively cutting the power source of a portion according to the function of the communication section 114.

As described above, according to the portable information apparatus 110 of the embodiment, it is possible to provide the portable information apparatus 110 being of a high quality which has superior characteristics and reliability by including the piezoelectric vibrator 1 described above. Further, in addition thereto, it is possible to display the time information with a high accuracy which is stable in a long period.

Radio Controlled Timepiece

Next, an embodiment of a radio controlled timepiece according to the invention is described with reference to FIG. 8.

Figure 8:
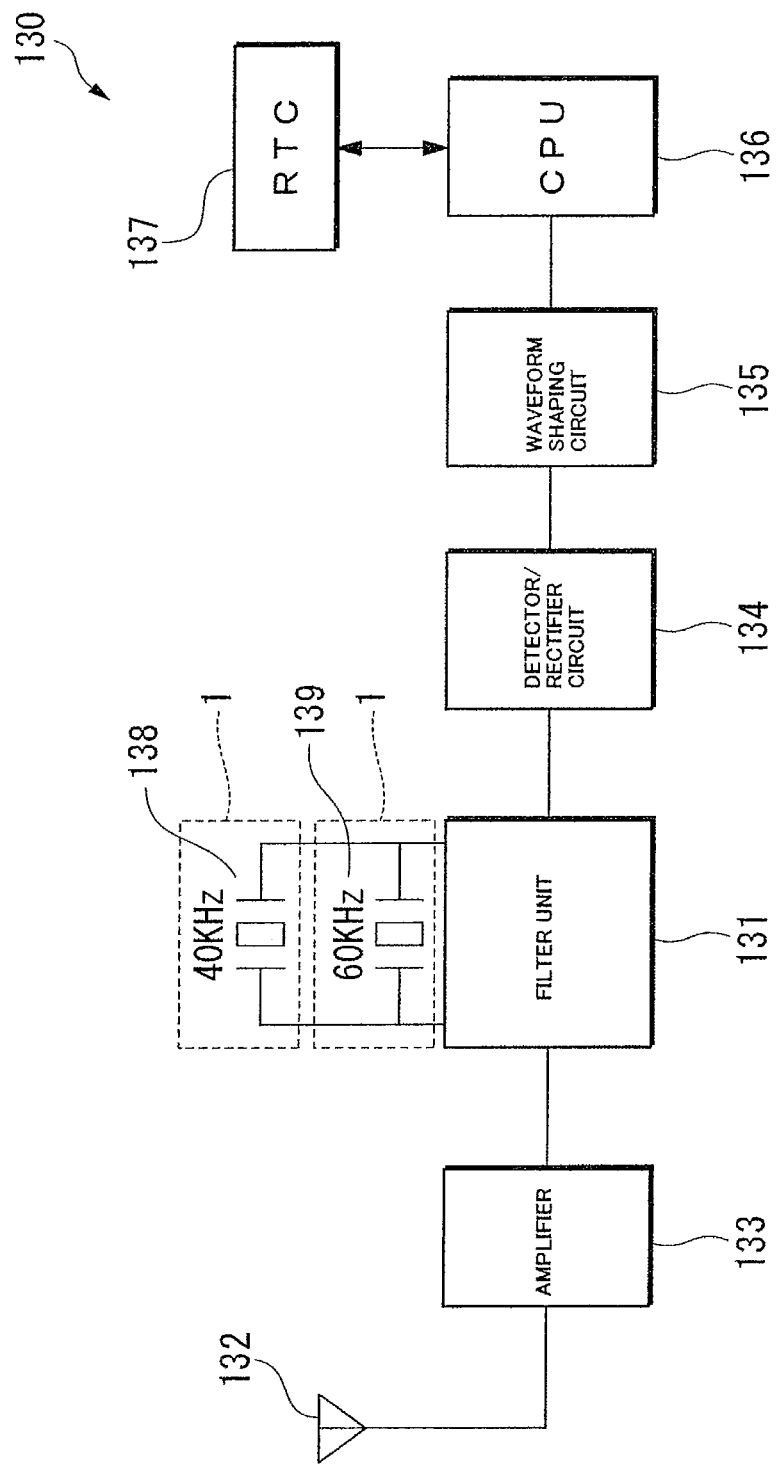
FIG. 8 is a configuration view illustrating a radio controlled timepiece according to an embodiment of the invention.

As illustrated in FIG. 8, the radio controlled timepiece 130 of the embodiment includes the piezoelectric vibrator 1 electrically connected to a filter section 131 and is a timepiece having functions for displaying the correct time by automatic correction by receiving a standard radio wave including timepiece information.

There are transmitting stations which transmit the standard radio waves in Fukushima (40 kHz) and Saga (60 kHz) in Japan, and the transmitting stations transmit the standard radio waves, respectively. Since a long wave such as 40 kHz or 60 kHz has both a property of propagating through the surface of the earth and a property of propagating through an ionized layer and the surface of the earth while being reflected, a propagation range is wide and can cover the entirety of Japan with the two transmitting stations described above.

Hereinafter, a functional configuration of the radio controlled timepiece 130 is described in detail.

An antenna 132 receives the standard radio wave of the long wave such as 40 kHz or 60 kHz. The standard radio wave of the long wave is obtained by applying AM modulation on a carrier wave of 40 kHz or 60 kHz to the time information referred to as a time code. The standard radio wave of the long wave which is received is amplified by an amplifier 133, and is filtered and tuned by the filter section 131 having a plurality of piezoelectric vibrators 1.

The piezoelectric vibrators 1 of the embodiment include crystal vibrator sections 138 and 139 having the resonance frequency of 40 kHz and 60 kHz which is the same as the carrier frequency described above, respectively.

Further, a signal of a predetermined frequency which is filtered is detected and demodulated by a detection and rectification circuit 134. Then, the time code is extracted through a waveform shaping circuit 135 and is counted in a CPU 136.

The CPU 136 reads information such as the current year, the number of days, the day of the week, time or the like. The information that is read is reflected in an RTC 137 and correct time information is displayed.

Since the carrier wave is 40 kHz or 60 kHz, as the crystal vibrator sections 138 and 139, the vibrator having the tuning fork type structure described above is suitable.

Moreover, the above description is illustrated in the example in Japan but the frequency of the standard radio wave of the long wave is different in foreign countries. For example, the standard radio wave of 77.5 KHz is used in Germany. Therefore, if the radio controlled timepiece 130 capable of corresponding to foreign countries is incorporated in the portable apparatus, it is necessary to provide the piezoelectric vibrator 1 having a frequency different from that in Japan.

As described above, according to the radio controlled timepiece 130 of the embodiment, it is possible to provide the radio controlled timepiece 130 being of a high quality which has superior characteristics and reliability by including the piezoelectric vibrator 1 described above. Further, in addition thereto, it is possible to count the time with a high accuracy which is stable in a long period.

Further, a technical range of the invention is not limited to the embodiments and various modifications can be applied without departing from the scope of the invention.

For example, in the above embodiments, the piezoelectric vibrating piece 4 of the invention is employed in the piezoelectric vibrator 1 of the surface mount type but the invention is not limited to the embodiment. For example, the piezoelectric vibrator of the surface mount type may be formed by further fixing a piezoelectric vibrator of a ceramic package type or a piezoelectric vibrator of a cylinder package type of the related art, with a mold resin section.

What is claimed is:

1. A piezoelectric vibrating piece comprising:
    a pair of vibrating arm sections;
    a base section between the pair of vibrating arm sections; and
    connecting sections connecting base end sections of the pair of vibrating arm sections and a base end section of the base section,
    wherein the vibrating arm sections have bending points and the vibrating arm sections extend in a direction away from the base section and from the base end sections of the vibrating arm sections to the bending points, and the vibrating arm sections extend along the base section from the bending points to leading end sections of the vibrating arm sections, and a length from the base end sections to the leading end sections of the vibrating arm sections is L1, where the length from the base end sections of the vibrating arm sections to the bending points is L2, and a ratio L2/L1 is greater than 0.17.

2. The piezoelectric vibrating piece according to claim 1, wherein the leading end sections of the vibrating arm sections include widened sections where a width dimension of the widened sections is greater than a width dimension of the base end sections of the vibrating arm sections.

3. The piezoelectric vibrating piece according to claim 1, wherein the base section extends to the vicinity of the leading end sections of the vibrating arm sections.

4. The piezoelectric vibrating piece according to claim 1, wherein the piezoelectric vibrating piece further comprises groove sections extending along a longitudinal direction of the vibrating arm sections in main surfaces of the vibrating arm sections.

5. A piezoelectric vibrator comprising:
    the piezoelectric vibrating piece according to claim 1 in a package which is hermetically sealed,
    wherein the piezoelectric vibrating piece is mounted in the package in the base section.

6. An oscillator comprising:
    the piezoelectric vibrator according to claim 5,
    wherein the piezoelectric vibrator is electrically connected to an integrated circuit as an oscillator.

7. An electronic apparatus comprising:
    the piezoelectric vibrator according to claim 5,
    wherein the piezoelectric vibrator is electrically connected to a timer section.

8. A radio controlled timepiece comprising:
    the piezoelectric vibrator according to claim 5,
    wherein the piezoelectric vibrator is electrically connected to a filter section.

* * * * *